(12) United States Patent
Liu et al.

(10) Patent No.: US 11,849,626 B2
(45) Date of Patent: Dec. 19, 2023

(54) METHOD FOR PREPARING BENDABLE NANOPAPER-BASED FLEXIBLE SOLAR CELLS BY 3D AEROGEL JET PRINTING

(71) Applicant: South China University of Technology, Guangzhou (CN)

(72) Inventors: Detao Liu, Guangzhou (CN); Lingfeng Su, Guangzhou (CN); Meiyan Lin, Guangzhou (CN); Hao Ouyang, Guangzhou (CN); Jun Li, Guangzhou (CN); Haisong Qi, Guangzhou (CN)

(73) Assignee: South China University of Technology, Guangzhou (CN)

( * ) Notice: Subject to any disclaimer, the term of this patent is extended or adjusted under 35 U.S.C. 154(b) by 484 days.

(21) Appl. No.: 17/257,894

(22) PCT Filed: Oct. 25, 2018

(86) PCT No.: PCT/CN2018/111944
§ 371 (c)(1),
(2) Date: Jan. 5, 2021

(87) PCT Pub. No.: WO2020/010751
PCT Pub. Date: Jan. 16, 2020

(65) Prior Publication Data
US 2021/0273163 A1   Sep. 2, 2021

(30) Foreign Application Priority Data

Jul. 11, 2018  (CN) .......................... 201810754259.3

(51) Int. Cl.
*H10K 71/13* (2023.01)
*B33Y 10/00* (2015.01)
(Continued)

(52) U.S. Cl.
CPC .......... *H10K 71/135* (2023.02); *B29C 64/112* (2017.08); *B33Y 10/00* (2014.12);
(Continued)

(58) Field of Classification Search
CPC . H01L 31/00–208; B33Y 10/00; B33Y 40/10; B33Y 70/00; B33Y 80/00;
(Continued)

(56) References Cited

U.S. PATENT DOCUMENTS

| | | |
|---|---|---|
| 2016/0010279 A1 | 1/2016 | Hu et al. |
| 2017/0148944 A1* | 5/2017 | Hardin ...................... C09D 5/24 |
| 2019/0019911 A1* | 1/2019 | Hardin ................ H01L 31/0512 |

FOREIGN PATENT DOCUMENTS

| | | |
|---|---|---|
| CN | 1617355 A | 5/2005 |
| CN | 101533894 A | 9/2009 |

(Continued)

OTHER PUBLICATIONS

Chen Jimbo, Design and Preparation of New Flexible High Transparent Paper Material and its Application Research (Abstract), dated Feb. 28, 2017.

(Continued)

*Primary Examiner* — Jose R Diaz
(74) *Attorney, Agent, or Firm* — The Dobrusin Law Firm, PC

(57) ABSTRACT

The present invention discloses a method for preparing bendable nanopaper-based flexible solar cells by 3D aerogel jet printing. In this method, firstly all-cellulose paper is soaked in ionic liquid, and quickly partially dissolved and regenerated under the condition of hot pressing to produce nanopaper with high transmittance and high haze; and then a 3D aerogel jet printer is used to precisely print the respective layers of a solar cell on the surface of the nanopaper as a flexible substrate material, wherein the solar (Continued)

cell comprises an anode PFN/Ag NWs, an active layer CuPc/C$_{60}$/PTCBI/BCP and a cathode MoO$_3$/Ag/MoO$_3$, and the thickness of each layer is precisely controlled by setting the parameters of the 3D printer. The electrode grid line on the surface of the prepared paper flexible solar cell has a width less than 10 μm and a thickness less than 20 nm. The prepared flexible organic thin film solar cell has a photovoltaic conversion efficiency 50% to 70% higher than that of the traditional flexible solar cell.

10 Claims, 2 Drawing Sheets

(51) Int. Cl.
*B33Y 70/00* (2020.01)
*B33Y 80/00* (2015.01)
*B29C 64/112* (2017.01)
*B33Y 40/10* (2020.01)
*F26B 3/20* (2006.01)
*H10K 30/81* (2023.01)
*H10K 77/10* (2023.01)
*H10K 30/00* (2023.01)
*B82Y 30/00* (2011.01)

(52) U.S. Cl.
CPC ............... *B33Y 40/10* (2020.01); *B33Y 70/00* (2014.12); *B33Y 80/00* (2014.12); *F26B 3/20* (2013.01); *H10K 30/00* (2023.02); *H10K 30/81* (2023.02); *H10K 71/13* (2023.02); *H10K 77/111* (2023.02); *B82Y 30/00* (2013.01); *Y02E 10/549* (2013.01)

(58) Field of Classification Search
CPC .... H10K 71/13; H10K 71/135; H10K 77/111; F26B 3/20; B82Y 30/00; B29C 64/112; Y02E 10/549
See application file for complete search history.

(56) References Cited

FOREIGN PATENT DOCUMENTS

| | | |
|---|---|---|
| CN | 103545444 A | 1/2014 |
| CN | 105568768 A | 5/2016 |
| CN | 106192550 A | 12/2016 |
| CN | 107093493 A | 8/2017 |
| CN | 107507676 A | 12/2017 |
| JP | 2002076403 A | 3/2002 |
| WO | 2013/149789 A3 | 10/2013 |

OTHER PUBLICATIONS

Fang et al., Novel Nanostructured Paper with Ultrahigh Transparency and Ultrahigh Haze for Solar Cells, Dec. 8, 2013.
Journal of Materials Engineering, Preparation, Properties and Applications of Nanopaper Substrates for Flexible Electronics, dated Jun. 2018, pp. 1-10.
Search Report dated Apr. 11, 2019, Application No. PCT/CN2018/111944.

* cited by examiner

METHOD FOR PREPARING BENDABLE NANOPAPER-BASED FLEXIBLE SOLAR CELLS BY 3D AEROGEL JET PRINTING

FIELD OF THE INVENTION

The present invention, belonging to the field of new materials and new energy, relates to a method for preparing solar cells, in particular to a method for preparing flexible paper solar cells by 3D printing on the surface of flexible nano-optical paper with both high light transmittance and high haze.

BACKGROUND OF THE INVENTION

With the use of traditional fossil energy such as coal and oil, the environmental pressure is increasing, and the reserves of fossil energy are declining; and the consumption of energy in modern society is increasing rapidly. These result in a continuous increase in energy costs. Therefore, the development of more forms of clean energy has gradually become an urgent need for human survival. However, solar cells have not yet been widely used due to their high costs, low photovoltaic conversion efficiency, and opacity. Thus, the current research and development of solar cells are focused on reducing manufacturing costs, improving the transparency of solar cells, and optimizing the preparation process to improve the photovoltaic conversion efficiency.

At present, the solar cells that have been studied more and have more mature technology are silicon solar cells, which include monocrystalline silicon solar cells and polycrystalline silicon solar cells. The monocrystalline silicon solar cells have the highest photovoltaic conversion efficiency, but they have high costs, complex process and high environmental pressure. The use of organic materials, including organic small-molecule materials and polymer materials with good processing properties, to prepare solar cells not only expands the range of raw materials for solar cells, but also has the characteristics of large manufacturing area, simplicity, flexibility, and translucency. Both the organic small-molecule materials and the polymer materials can be prepared into 3D printing ink with solvents, and then assembled layer by layer into solar cells by the jet printing technology.

Organic solar cells can be divided according to their structures into three categories, Schottky organic cells, double-layer heterojunction organic cells, and bulk heterojunction organic cells. The main ways to improve the performance of solar cells include improving the cell structure and preparation process, synthesizing new materials, etc. Generally, a buffer layer is inserted between the electrode and the active layer heterojunction to reduce the energy level difference between the electrode and the active layer heterojunction material, so as to improve the transport of electrons and holes and reduce the recombination of electrons and holes, thereby increasing the photocurrent and improving the photovoltaic conversion efficiency of the cells. In the prior art, the active layer is mostly prepared by spin coating, spraying, ink-jet printing and the like by a solution method, and the electrode and buffer layer are prepared by a vacuum evaporation method. In 1986, Deng Qingyun prepared an organic solar cell with a photovoltaic conversion efficiency of 1%. In 2004, Hou Xiaoyuan et al. of Fudan University in Shanghai prepared a solar cell (200410089314.X) with a similar structure by modifying the materials of each layer, making the photovoltaic conversion efficiency reach 4.08%. After years of development, the photovoltaic conversion efficiency of organic solar cells has so far exceeded 11%.

Having high light transmittance and high haze, nano-optical paper can, on the one hand, ensure that the incident light reaches the active layer and, on the other hand, extend the transmission distance of light in the solar cell and reduce the influence of the incident angle on the reflection of light, thereby effectively improving the photoenergy utilization rate of solar cells. In traditional organic solar cells, solar cells are usually deposited on the surface of FTO or ITO. Although the conductive glass has excellent electrical conductivity and good light transmittance, it does not have high haze and is thus difficult to make full use of light. Besides, because the conductive glass does not have the flexibility of nano-optical paper, the application of solar cells using FTO or ITO as the substrate is limited.

The traditional method of depositing solar cells requires the combination of spin coating, thermal evaporation, annealing treatment, etching, and other processes. It is relatively cumbersome and requires switching processes, mainly due to the different dispersibility and preparation conditions of the materials of each layer, as well as the inability to uniformly deposit the materials at specified points and positions on the surface of the substrate in the preparation process, resulting in material waste and low efficiency. By preparing the conductive electrode material, buffer layer and active layer material into ink, and using a 3D printer with a heating table to print each layer of material at specified points and positions, the problems such as high requirements of the vacuum evaporation method on the environment and equipment, large material loss in the spin coating method and difficulty in etching treatment are solved. It is particularly promising to combine the 3D printing technology and nanopaper to prepare solar cells.

CONTENTS OF THE INVENTION

An object of the present invention is to provide a method for preparing bendable nanopaper-based flexible solar cells by 3D aerogel jet printing. The solar cell comprises a transparent flexible paper substrate/a cathode/an active layer/an anode, wherein all the cell materials are one-time formed by 3D printing.

The object of the present invention is achieved by the following technical solution:

1. A method for preparing bendable nanopaper-based flexible solar cells by 3D aerogel jet printing is provided, comprising the following steps:
    1) soaking all-cellulose paper in an ionic liquid for 10-30 s, and then hot-pressing for 30-120 s to partially dissolve the surface of the all-cellulose paper and fill pores thereon, so as to achieve the consistency of optical refractive index in the thickness direction, wherein the ionic liquid is an imidazole ionic liquid or a zinc chloride solution;
    2) soaking the partially dissolved all-cellulose paper in absolute ethanol for 5-30 s to remove the ionic liquid, and allowing the dissolved cellulose to get re-aggregated to produce regenerated cellulose paper;
    3) hot-press drying the regenerated cellulose paper, and cooling to room temperature under pressure;
    4) repeating steps 1) to 3) multiple times with the dried all-cellulose paper obtained in step 3) to obtain nano paper with high light transmittance and high haze;
    5) preparation of dispersions of respective hierarchical materials of solar cells: preparing ethanol dispersions of $MoO_3$, Ag, Ag NWs and CuPc, respectively; preparing o-dichlorobenzene dispersions of $C_{60}$ and PTCBI, respectively; and preparing an isopropanol dispersion of BCP;

6) printing cathode: loading the ultrasonically dispersed dispersion into a printer cartridge, and printing an $MoO_3$ layer of 6-15 nm, an Ag layer of 6-20 nm and an $MoO_3$ layer of 6-15 nm successively on the surface of nano-optical paper fixed on a sample stage of the 3D printer, wherein these layers each have the same shape and together form a cathode block; arranging a plurality of the cathode blocks longitudinally and laterally at intervals into a square array to form a cathode; allowing the nano-$MoO_3$ layer to volatilize the solvent at 80° C. to 110° C. for 10-30 min after printing, and annealing the nano-Ag layer at 80° C. to 110° C. for 10-30 min after printing;

7) printing effective layer: loading the ultrasonically dispersed dispersion into the printer cartridge, and printing a CuPc layer of 30-50 nm, a $C_{60}$ layer of 30-50 nm, a PTCBI layer of 30-50 nm and a BCP layer of 6 nm on the surface of the square-array cathode of the nano-optical paper, wherein these layers each have the same shape and together form an effective layer strip; arranging a plurality of the effective layer strips longitudinally or laterally at intervals to form an effective layer, and allowing each layer of the effective layer to volatilize the solvent at 80° C. to 110° C. for 10-30 min after printing; and 8) printing anode: loading the ultrasonically dispersed dispersion into the printer cartridge, and printing a PFN layer of 5-20 nm and an Ag NWs layer of 6-20 nm successively on the surface of the effective layer of the nano-optical paper, wherein the PFN layer and the Ag NWs layer have the same shape and together form an anode block, and each anode block overlaps by 3-5 μm with two adjacent cathodes arranged in the length direction; arranging a plurality of the anode blocks longitudinally and laterally at intervals into a square array to form an anode; and annealing the PFN layer and the Ag NWs layer at 80° C. to 110° C. for 10-30 min after printing, respectively.

In order to further achieve the object of the present invention, preferably, the hot-pressing in step 1) is accomplished by applying a pressure of 0.5-2 MPa to the soaked all-cellulose paper sandwiched between polytetrafluoroethylene films using a plate vulcanizer at 75° C. to 120° C.

Preferably, the imidazole ionic liquid in step 1) is an N-ethylimidazole hydrogen phosphite ionic liquid, and the concentration of the zinc chloride solution is 65 wt %.

Preferably, the all-cellulose paper in step 1) is a Double-circle medium-speed qualitative filter paper.

Preferably, in step 3), the "hot-press drying" is accomplished by hot-press drying the regenerated cellulose paper at a temperature of 60° C. to 80° C. and a pressure of 2-5 MPa using the plate vulcanizer for 10-30 min, and the "cooling to room temperature under pressure" is done slowly under a pressure of 2-5 MPa.

Preferably, in step 5), the ethanol dispersions of $MoO_3$, Ag, Ag NWs and CuPc have a concentration of 0.05-0.2 wt %, the o-dichlorobenzene dispersions of $C_{60}$ and PTCBI have a concentration of 0.05-0.2 wt %, the isopropanol dispersion of BCP has a concentration of 0.05-0.2 wt %, and the hierarchical material dispersions have a concentration of 4-40 cp, and these dispersions are ultrasonically dispersed for 30-40 min before being used.

Preferably, in step 6), the length, width and thickness of each cathode block are 15-30 μm, 5-10 μm and 18-50 nm, respectively, and these cathode blocks are arranged longitudinally and laterally at an interval of 2-5 μm and 5-10 μm, respectively.

Preferably, in step 7), the length, width and thickness of the effective layer strips are 150-300 μm, 15-30 μm and 80-150 nm, respectively, and these effective layer strips are arranged longitudinally and laterally at an interval of 2-5 μm and 5-10 μm, respectively.

Preferably, in step 8), the length, width and thickness of each anode block are 15-30 μm, 5-10 μm and 11-40 nm, respectively, and these anode blocks are arranged longitudinally and laterally at an interval of 2-5 μm and 5-10 μm, respectively.

Preferably, the printer cartridge in steps 6), 7) and 8) is a UC-320 printer cartridge, and the "repeating steps 1) to 3) multiple times" mentioned in step 4) means repeating steps 1) to 3) for 2-3 times.

In the present invention, a nano-optical paper substrate is prepared by the ionic liquid partial dissolution technology, having a diameter of 5-10 nm for its nanocellulose component and a thickness of only 35 μm. The substrate has a light transmittance of 91% (at 550 nm) and a tensile strength of 100 MPa as measured by an ultraviolet-visible spectrophotometer, and has flexibility similar to that of a plastic film.

The cathode of the present invention is $MoO_3$/Ag/$MoO_3$, in which the first layer of $MoO_3$ plays a role in increasing the smoothness between Ag and the nano-optical paper, and the second layer of $MoO_3$ is thinner and serves as a buffer between the Ag layer and the active layer. The active layer of the present invention is CuPc/$C_{60}$/PTCBI/BCP. The anode of the present invention is PFN/Ag NWs. In the active layer, BCP is used as the buffer material between the cathode and the active layer, PTCBI/$C_{60}$ is used as the hole transport layer, and CuPc is used as the electron transport layer; after the excitons are generated in the active layer, they need to diffuse to the PTCBI/$C_{60}$/BCP interface to be split into free carriers that contribute to the cathode and anode current.

The nano-optical paper of the present invention, after the cathode is deposited, has a light transmittance of 86.5% (at 550 nm) as measured by an ultraviolet-visible spectrophotometer, and has good conductivity (26.2 Ω/sq) and surface roughness ($R_a$=3.13 nm, $R_q$=4.03 nm).

The 3D printer of the present invention has a vacuum suction table, a maximum temperature of 110° C., and a plurality of switchable ink cartridges and nozzles.

The cathode and anode of the printed solar cell of the present invention have a square array structure and are not fully covered, with the spatial overlapping parts being a rectangular structure of 3-5 μm; large-area solar cells can be prepared by repeating the overlapping parts; the effective layer is composed of several effective layer strips overlapping with the cathode and anode. Due to the flexibility of nano-optical paper, the prepared solar cell has the same flexibility as nano-optical paper.

Compared with the prior art, the present invention has the following advantages and beneficial effects:
1) Compared with the spin coating method and thermal evaporation method, the 3D aerogel jet printing method can print the respective layers of solar cells at specified points and positions and control the thickness precisely by setting printer parameters and, by preparing a solar cell with an overlapping and staggered square array structure, can not only save the active layer and buffer layer materials of the solar cell, but also reduce the material loss and cell structure damage caused by etching the electrode, thereby avoiding the decrease in efficiency caused by the increase of resistance during the series connection of traditional single junction solar cells.

2) Compared with the spin coating method, the 3D aerogel jet printing method avoids the influence of the film surface flatness and rotation film-formation uniformity on the hierarchical structure of the cell, and effectively reduces the influence of the preparation method on the cell efficiency when preparing the overlapping and staggered square array solar cells, thereby obtaining an electrode with lower resistance.

3) The 3D aerogel jet printer, having multiple freely-switchable ink cartridges and a flat heating table with a heating temperature up to 110° C., can realize one-time molding of the solar cells and free design of the hierarchical structure, and prepare large-area solar cells skillfully by overlapping the small area of the cathode and anode when preparing the overlapping and staggered square array solar cells.

4) The electrode grid line on the surface of the paper flexible solar cell prepared by the present invention has a width less than 10 μm and a thickness less than 20 nm; and the flexible organic thin film solar cell prepared by the present invention has a conversion efficiency 50% to 70% higher than that of the traditional flexible solar cell.

5) The present invention uses flexible nano-optical paper to replace traditional glass, flexible polymer film and other materials, and fully applies the 3D printing technology in the preparation process of paper solar cells, having the characteristics of simple process, flexibility and bendability of solar cells, stable product quality, saving resources and materials, high integration, and so on.

DETAILED DESCRIPTION OF THE EMBODIMENTS

The present invention provides a method for preparing bendable nanopaper-based flexible solar cells by 3D aerogel jet printing. In order to be more deeply understood, the present invention will be further explained in combination with examples. It should be noted that the scope of protection claimed by the present invention is not limited to the scope expressed in the examples, and the expansion and extension of the present invention fall within the protection scope of the present invention.

Example 1

Figure 2:
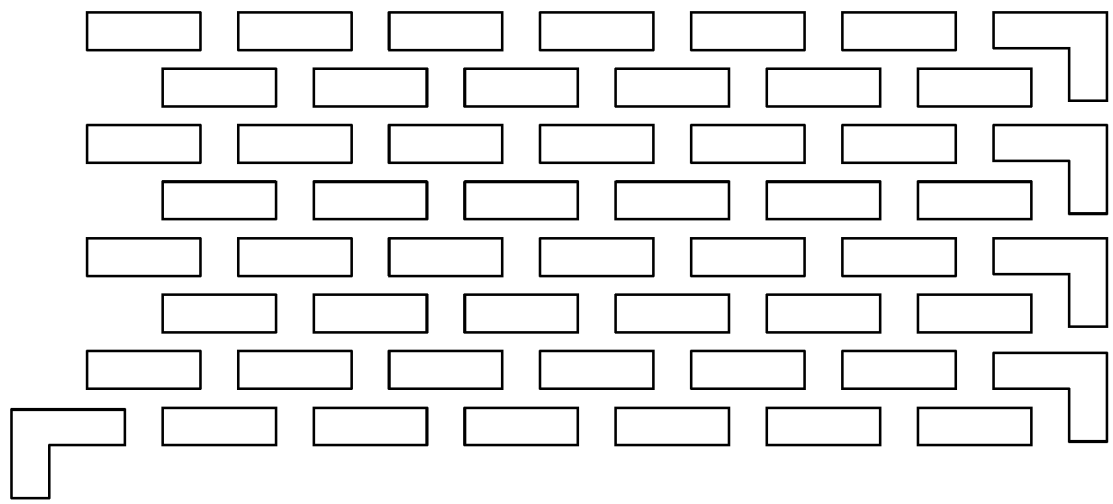
FIG. 2 is a plan view of the cathode of the solar cell prepared by the present invention.
Figure 3:
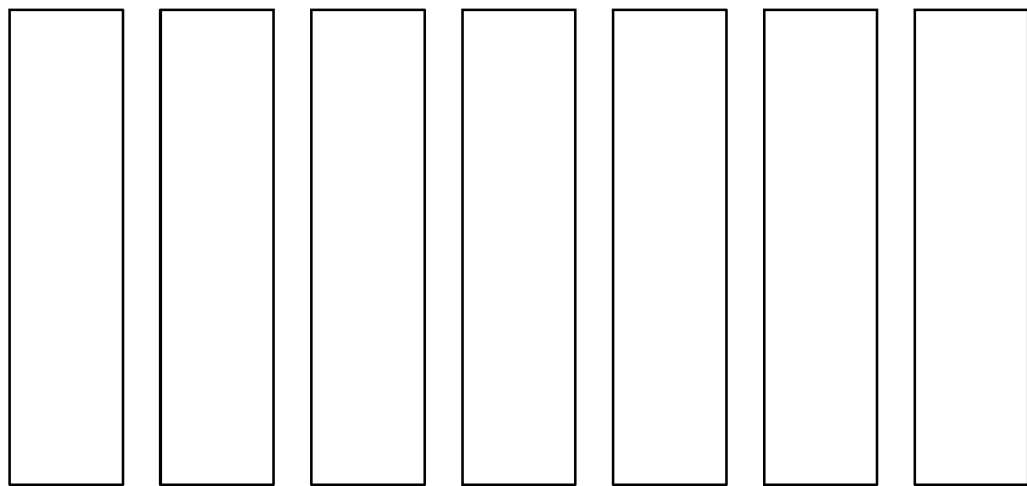
FIG. 3 is a plan view of the effective layer of the solar cell prepared by the present invention.
Figure 4:
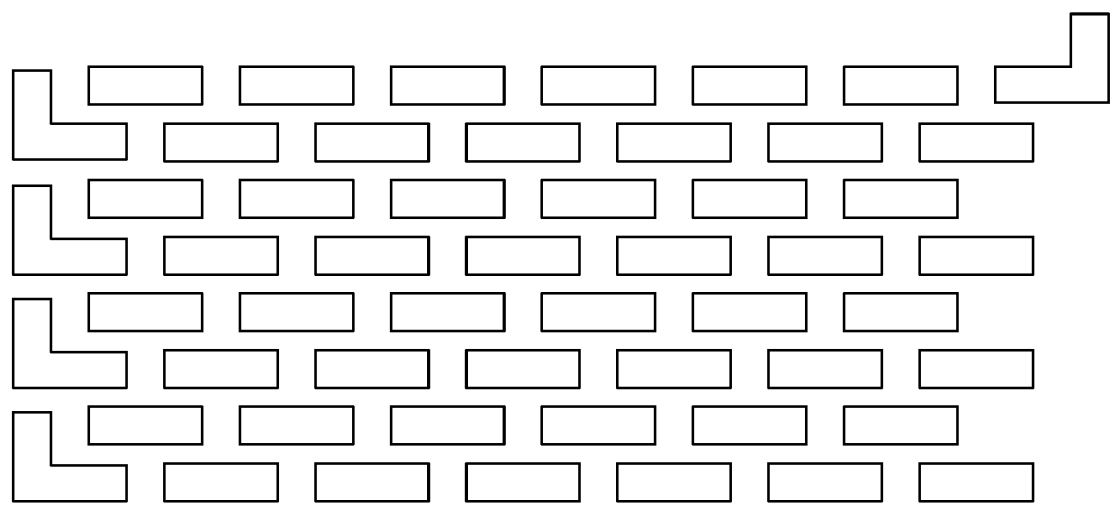
FIG. 4 is a plan view of the anode of the solar cell prepared by the present invention.

A method for preparing bendable nanopaper-based flexible solar cells by 3D aerogel jet printing was used, involving the following steps and process conditions:
1. preparation of nano-optical paper on flexible paper substrate: all-cellulose base paper was directly soaked in an ionic liquid, and then treated by hot rolling to regenerate a nano-optical paper substrate; the process comprised the following steps:
1) soaking all-cellulose paper (Double-circle medium-speed qualitative filter paper) in an ionic liquid (N-ethylimidazole hydrogen phosphite) for 10 s, and then sandwiching the paper between polytetrafluoroethylene films to pressurize it by a plate vulcanizer to 1 MPa at 80° C. for 120 s to partially dissolve the surface of the paper and fill the pores thereon, so as to ensure that the light refractive index of the prepared partially dissolved all-cellulose paper was almost the same in the thickness direction;
2) soaking the partially dissolved all-cellulose paper in absolute ethanol for 30 s to remove the ionic liquid, and allowing the dissolved cellulose to get re-aggregated to produce regenerated cellulose paper;
3) hot-press drying the regenerated cellulose paper by the plate vulcanizer at 80° C. and 5 MPa for 15 min, and cooling slowly at 5 MPa to room temperature; and
4) repeating steps 1) to 3) twice with the dried all-cellulose paper obtained in step 3) to obtain a nano-optical paper substrate with high light transmittance and high haze;
2. preparation of organic solar cells: the 3D printing technology was used to successively print solar cell raw materials layer by layer; the process comprised the following steps:
1) preparation of dispersions of respective hierarchical materials of solar cells: preparing 0.2 wt % ethanol dispersions of $MoO_3$, Ag, Ag NWs and CuPc, respectively; preparing 0.2 wt % o-dichlorobenzene dispersions of $C_{60}$ and PTCBI, respectively; preparing a 0.05 wt % isopropanol dispersion of BCP; and dispersing these dispersions ultrasonically for 30 min before use;
2) printing cathode: loading the ultrasonically dispersed dispersion into a UC-320 printer cartridge, and printing an $MoO_3$ layer of 8 nm, an Ag layer of 20 nm and an $MoO_3$ layer of 12 nm successively on the surface of nano-optical paper fixed on a sample stage of the 3D printer, wherein these layers each had the same shape and together formed a cathode block having a plane structure as shown in FIG. 2, the length, width and thickness of each cathode block were 15 μm, 10 μm and 40 nm, respectively, and these cathode blocks were arranged longitudinally and laterally at an interval of 5 μm and 5 μm, respectively; arranging a plurality of the cathode blocks longitudinally and laterally at intervals into a square array to form a cathode; evaporating the solvent of the $MoO_3$ layer at 100° C. for 15 min, and then annealing the Ag layer at 100° C. for 15 min;
3) printing effective layer: loading the ultrasonically dispersed dispersion into the UC-320 printer cartridge, and printing a CuPc layer of 30 nm, a $C_{60}$ layer of 30 nm, a PTCBI layer of 50 nm and a BCP layer of 6 nm successively on the surface of the square-array cathode of the nano-optical paper, wherein these layers each had the same shape and together formed an effective layer strip having a plane structure as shown in FIG. 3, and the effective layer strip had a width of 15 μm and a lateral spacing of 5 μm; arranging a plurality of the effective layer strips longitudinally at intervals to form an effective layer, and allowing them to volatilize the solvent at 100° C. for 15 min; and
4) printing anode: loading the ultrasonically dispersed dispersion into the UC-320 printer cartridge, and printing a PFN layer of 5 nm as well as an Ag NWs layer, a PFN layer and an Ag NWs layer of 20 nm successively on the surface of the effective layer of the nano-optical paper, wherein these layers each had the same shape and together formed an anode block having a plane structure as shown in FIG. 4, the length, width and thickness of each anode block were 15 μm, 10 μm and 25 nm, respectively, and these anode blocks were arranged longitudinally and laterally at an interval of 5 μm and 5 μm, respectively; arranging a plurality of the anode blocks longitudinally and laterally at intervals into a square array to form an anode; and annealing the FN layer and the Ag NWs layer at 100° C. for 15 min after printing, respectively.

Figure 1:
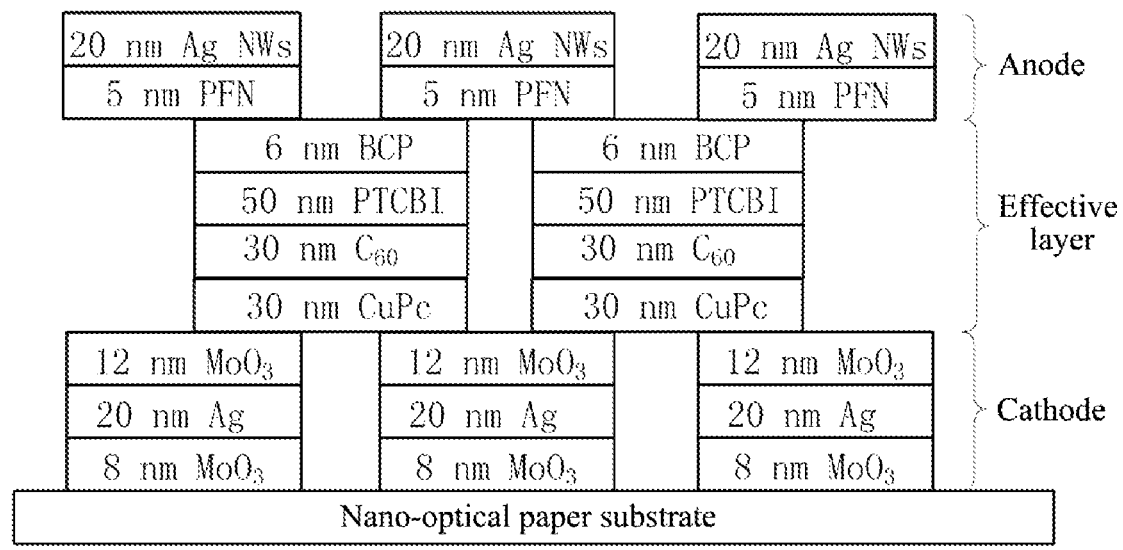
FIG. 1 is a sectional view of the hierarchical structure of the solar cell prepared in Example 1 of the present invention.

FIG. 1 is a sectional view of the hierarchical structure of the solar cell prepared in this example. The shape, structure and position of the cathode, effective layer and anode in step 2 can be clearly seen from this figure.

The bendable nanopaper-based flexible solar cell prepared by the above process and method had the same characteristics as nano-optical paper in flexibility, bendability, portability, etc. The 3D printer had a repetitive positioning accuracy of 20 μm and a repetitive printing accuracy of 5 μm. In the printing process, the ultrasonically dispersed hierarchical materials of the solar cell were dispersed into aerosol particles by the ink supply system of the printer, and then sprayed onto the surface of the nano-optical paper with high transparency (about 91%) and high haze (about 89%) having been subjected to ionic liquid immersion and hot rolling process. The respective hierarchical structures were tightly combined on the surface of the flexible nano-optical paper substrate, producing no cracks when bent and generating photo-generated voltage and photo-generated current under sunlight.

The test results were as follows: The nano-optical paper with high transparency and haze was used as a flexible substrate to prepare solar cells by 3D aerogel jet printing; the electrode grid line on the surface of the flexible paper solar cell had a width less than 10 μm and a thickness less than 20 nm; the prepared bendable nanopaper-based flexible solar cell had a photovoltaic conversion efficiency of 7.02% measured at AM1.5 and 25° C., which was 72% higher than that of a traditional solar cell with a flexible plastic substrate; and the ratio of the average photovoltaic conversion efficiency of the solar cell after the solar cell was bent along a circle with a radius of 3.5 mm in the deposition direction of the solar cell to the average photovoltaic conversion efficiency of the solar cell before the bending was 1.08, indicating that the cell efficiency changed little during bending. Other test results were shown in FIG. 3. Nano-optical paper, having high light transmittance and high haze, is mainly advantageous in that it can, on the one hand, ensure that the incident light reaches the active layer and, on the other hand, extend the transmission distance of light in the solar cell and reduce the influence of the incident angle on the reflection of light, thereby making the light repeatedly act on the effective layer and effectively improving the photoenergy utilization rate of solar cells.

Usually deposited on the surface of FTO or ITO, traditional organic solar cells are not flexible and do not have high haze, and are thus difficult to make full use of light, although the conductive glass has excellent conductivity and light transmittance. Therefore, this example has broad application prospects by combining 3D aerogel printing technology and nano-optical paper to prepare solar cells.

Example 2

A method for preparing bendable nanopaper-based flexible solar cells by 3D aerogel jet precise printing was used, involving the following steps and process conditions:

1. preparation of nano-optical paper on flexible paper substrate: all-cellulose base paper was directly soaked in an ionic liquid, and then treated by hot rolling to regenerate a nano-optical paper substrate; the process comprised the following steps:
1) soaking all-cellulose paper (Double-circle medium-speed qualitative filter paper) in an ionic liquid (N-ethylimidazole hydrogen phosphite) for 10 s, and then sandwiching the paper between polytetrafluoroethylene films to pressurize it by a plate vulcanizer to 1 MPa at 80° C. for 30 s to partially dissolve the surface of the paper and fill the pores thereon, so as to ensure that the light refractive index of the prepared partially dissolved all-cellulose paper was almost the same in the thickness direction;
2) soaking the partially dissolved all-cellulose paper in absolute ethanol for 30 s to remove the ionic liquid, and allowing the dissolved cellulose to get re-aggregated to produce regenerated cellulose paper;
3) hot-press drying the regenerated cellulose paper by the plate vulcanizer at 80° C. and 5 MPa for 15 min, and cooling slowly at 5 MPa to room temperature; and
4) repeating steps 1) to 3) twice with the dried all-cellulose paper obtained in step 3) to obtain a nano-optical paper substrate with high light transmittance and high haze;
2. preparation of organic solar cells: the 3D printing technology was used to successively print solar cell raw materials layer by layer; the process comprised the following steps:
1) preparation of dispersions of respective hierarchical materials of solar cells: preparing 0.2 wt % ethanol dispersions of $MoO_3$, Ag, Ag NWs and CuPc, respectively; preparing 0.2 wt % o-dichlorobenzene dispersions of $C_{60}$ and PTCBI, respectively; preparing a 0.05 wt % isopropanol dispersion of BCP; and dispersing these dispersions ultrasonically for 30 min before use;
2) printing cathode: loading the ultrasonically dispersed dispersion into a UC-320 printer cartridge, and printing an $MoO_3$ layer of 8 nm, an Ag layer of 20 nm and an $MoO_3$ layer of 12 nm successively on the surface of nano-optical paper fixed on a sample stage of the 3D printer, wherein these layers each had the same shape and together formed a cathode block, the length, width and thickness of each cathode block were 15 μm, 10 μm and 40 nm, respectively, and these cathode blocks were arranged longitudinally and laterally at an interval of 5 μm and 5 μm, respectively; arranging a plurality of the cathode blocks longitudinally and laterally at intervals into a square array to form a cathode; evaporating the solvent of the $MoO_3$ layer at 100° C. for 15 min, and then annealing the Ag layer at 100° C. for 15 min;
3) printing effective layer: loading the ultrasonically dispersed dispersion into the UC-320 printer cartridge, and printing a CuPc layer of 30 nm, a $C_{60}$ layer of 30 nm, a PTCBI layer of 50 nm and a BCP layer of 6 nm successively on the surface of the square-array cathode of the nano-optical paper, wherein these layers each had the same shape and together formed an effective layer strip, and the effective layer strip had a width of 15 μm and a lateral spacing of 5 μm; arranging a plurality of the effective layer strips longitudinally at intervals to form an effective layer, and allowing them to volatilize the solvent at 100° C. for 15 min; and
4) printing anode: loading the ultrasonically dispersed dispersion into the UC-320 printer cartridge, and printing a PFN layer of 5 nm as well as an Ag NWs layer, a PFN layer and an Ag NWs layer of 20 nm successively on the surface of the effective layer of the nano-optical paper, wherein these layers each had the same shape and together formed an anode block, the length, width and thickness of each anode block were 15 μm, 10 μm and 25 nm, respectively, and these anode blocks were arranged longitudinally and laterally at an interval of 5 μm and 5 μm, respectively; arranging a plurality of the anode blocks longitudinally and laterally at intervals into a square array to form an anode; and annealing the PFN layer and the Ag NWs layer at 100° C. for 15 min after printing, respectively.

In the process of preparing nano-optical paper by using ionic liquid, due to the short time of treatment of the all-cellulose paper with the ionic liquid and the low fiber solubility, the regenerated nano-optical paper had higher surface porosity, higher roughness, higher haze and lower transparency, such that the resistance of the cathode electrode layer was increased, the light utilization rate of the prepared solar cell was reduced, and the cell efficiency was reduced to 6.08%.

Example 3

A method for preparing bendable nanopaper-based flexible solar cells by 3D aerogel jet precise printing was used, involving the following steps and process conditions:
1. preparation of nano-optical paper on flexible paper substrate: all-cellulose base paper was directly soaked in an ionic liquid, and then treated by hot rolling to regenerate a nano-optical paper substrate; the process comprised the following steps:
1) soaking all-cellulose paper (Double-circle medium-speed qualitative filter paper) in an ionic liquid (N-ethylimidazole hydrogen phosphite) for 10 s, and then sandwiching the paper between polytetrafluoroethylene films to pressurize it by a plate vulcanizer to 1 MPa at 80° C. for 30 s to partially dissolve the surface of the paper and fill the pores thereon, so as to ensure that the light refractive index of the prepared partially dissolved all-cellulose paper was almost the same in the thickness direction;
2) soaking the partially dissolved all-cellulose paper in absolute ethanol for 30 s to remove the ionic liquid, and allowing the dissolved cellulose to get re-aggregated to produce regenerated cellulose paper;
3) hot-press drying the regenerated cellulose paper by the plate vulcanizer at 80° C. and 5 MPa for 15 min, and cooling slowly at 5 MPa to room temperature; and
4) repeating steps 1) to 3) twice with the dried all-cellulose paper obtained in step 3) to obtain a nano-optical paper substrate with high light transmittance and high haze;
2. preparation of organic solar cells: the 3D printing technology was used to successively print solar cell raw materials layer by layer; the process comprised the following steps:
1) preparation of dispersions of respective hierarchical materials of solar cells: preparing 0.2 wt % ethanol dispersions of $MoO_3$, Ag, Ag NWs and CuPc, respectively; preparing 0.2 wt % o-dichlorobenzene dispersions of $C_{60}$ and PTCBI, respectively; preparing a 0.05 wt % isopropanol dispersion of BCP; and dispersing these dispersions ultrasonically for 30 min before use;
2) printing cathode: loading the ultrasonically dispersed dispersion into a UC-320 printer cartridge, and printing an $MoO_3$ layer of 15 nm, an Ag layer of 20 nm and an $MoO_3$ layer of 15 nm successively on the surface of nano-optical paper fixed on a sample stage of the 3D printer, wherein these layers each had the same shape and together formed a cathode block, the length, width and thickness of each cathode block were 15 μm, 10 μm and 40 nm, respectively, and these cathode blocks were arranged longitudinally and laterally at an interval of 5 μm and 5 μm, respectively; arranging a plurality of the cathode blocks longitudinally and laterally at intervals into a square array to form a cathode; evaporating the solvent of the $MoO_3$ layer at 100° C. for 15 min, and then annealing the Ag layer at 100° C. for 15 min;
3) printing effective layer: loading the ultrasonically dispersed dispersion into the UC-320 printer cartridge, and printing a CuPc layer of 30 nm, a $C_{60}$ layer of 30 nm, a PTCBI layer of 50 nm and a BCP layer of 6 nm successively on the surface of the square-array cathode of the nano-optical paper, wherein these layers each had the same shape and together formed an effective layer strip, and the effective layer strip had a width of 15 μm and a lateral spacing of 5 μm; arranging a plurality of the effective layer strips longitudinally at intervals to form an effective layer, and allowing them to volatilize the solvent at 100° C. for 15 min; and
4) printing anode: loading the ultrasonically dispersed dispersion into the UC-320 printer cartridge, and printing a PFN layer of 5 nm as well as an Ag NWs layer, a PFN layer and an Ag NWs layer of 20 nm successively on the surface of the effective layer of the nano-optical paper, wherein these layers each had the same shape and together formed an anode block, the length, width and thickness of each anode block were 15 μm, 10 μm and 25 nm, respectively, and these anode blocks were arranged longitudinally and laterally at an interval of 5 μm and 5 μm, respectively; arranging a plurality of the anode blocks longitudinally and laterally at intervals into a square array to form an anode; and annealing the PFN layer and the Ag NWs layer at 100° C. for 15 min after printing, respectively.

In the process of preparing nano-optical paper by using ionic liquid, due to the short time of treatment of the all-cellulose paper with the ionic liquid and the low fiber solubility, the regenerated nano-optical paper had higher surface porosity, higher roughness, higher haze and lower transparency, and the smoothness of each layer was improved and the resistance of cathode was reduced by increasing the thickness of the deposited $MoO_3$, such that the resistance of the cathode was increased, the light utilization rate of the prepared solar cell was reduced, and the cell efficiency was reduced to 6.55%.

Example 4

A method for preparing bendable nanopaper-based flexible solar cells by 3D aerogel jet precise printing was used, involving the following steps and process conditions:
1. preparation of nano-optical paper on flexible paper substrate: all-cellulose base paper was directly soaked in an ionic liquid, and then treated by hot rolling to regenerate a nano-optical paper substrate; the process comprised the following steps:
1) soaking all-cellulose paper (Double-circle medium-speed qualitative filter paper) in an ionic liquid (N-ethylimidazole hydrogen phosphite) for 10 s, and then sandwiching the paper between polytetrafluoroethylene films to pressurize it by a plate vulcanizer to 1 MPa at 80° C. for 60 s to partially dissolve the surface of the paper and fill the pores thereon, so as to ensure that the light refractive index of the prepared partially dissolved all-cellulose paper was almost the same in the thickness direction;

2) soaking the partially dissolved all-cellulose paper in absolute ethanol for 30 s to remove the ionic liquid, and allowing the dissolved cellulose to get re-aggregated to produce regenerated cellulose paper;

3) hot-press drying the regenerated cellulose paper by the plate vulcanizer at 80° C. and 5 MPa for 15 min, and cooling slowly at 5 MPa to room temperature; and 4) repeating steps 1) to 3) twice with the dried all-cellulose paper obtained in step 3) to obtain a nano-optical paper substrate with high light transmittance and high haze;

2. preparation of organic solar cells: the 3D printing technology was used to successively print solar cell raw materials layer by layer; the process comprised the following steps:

1) preparation of dispersions of respective hierarchical materials of solar cells: preparing 0.2 wt % ethanol dispersions of $MoO_3$, Ag, Ag NWs and CuPc, respectively; preparing 0.2 wt % o-dichlorobenzene dispersions of $C_{60}$ and PTCBI, respectively; preparing a 0.05 wt % isopropanol dispersion of BCP; and dispersing these dispersions ultrasonically for 30 min before use;

2) printing cathode: loading the ultrasonically dispersed dispersion into a UC-320 printer cartridge, and printing an $MoO_3$ layer of 12 nm, an Ag layer of 20 nm and an $MoO_3$ layer of 12 nm successively on the surface of nano-optical paper fixed on a sample stage of the 3D printer, wherein these layers each had the same shape and together formed a cathode block, the length, width and thickness of each cathode block were 15 µm, 10 µm and 40 nm, respectively, and these cathode blocks were arranged longitudinally and laterally at an interval of 5 µm and 5 µm, respectively; arranging a plurality of the cathode blocks longitudinally and laterally at intervals into a square array to form a cathode; evaporating the solvent of the $MoO_3$ layer at 100° C. for 15 min, and then annealing the Ag layer at 100° C. for 15 min;

3) printing effective layer: loading the ultrasonically dispersed dispersion into the UC-320 printer cartridge, and printing a CuPc layer of 40 nm, a $C_{60}$ layer of 30 nm, a PTCBI layer of 30 nm and a BCP layer of 6 nm successively on the surface of the square-array cathode of the nano-optical paper, wherein these layers each had the same shape and together formed an effective layer strip, and the effective layer strip had a width of 15 µm and a lateral spacing of 5 µm; arranging a plurality of the effective layer strips longitudinally at intervals to form an effective layer, and allowing them to volatilize the solvent at 100° C. for 120 min; and 4) printing anode: loading the ultrasonically dispersed dispersion into the UC-320 printer cartridge, and printing a PFN layer of 5 nm as well as an Ag NWs layer, a PFN layer and an Ag NWs layer of 20 nm successively on the surface of the effective layer of the nano-optical paper, wherein these layers each had the same shape and together formed an anode block, the length, width and thickness of each anode block were 15 µm, 10 µm and 25 nm, respectively, and these anode blocks were arranged longitudinally and laterally at an interval of 5 µm and 5 µm, respectively; arranging a plurality of the anode blocks longitudinally and laterally at intervals into a square array to form an anode; and annealing the PFN layer and the Ag NWs layer at 100° C. for 15 min after printing, respectively.

By changing the deposition thickness of the electron acceptors and electron donors, the number of the photo-generated excitons and holes was changed, and the photovoltaic conversion efficiency of the solar cell was adjusted, such that the cell efficiency reached 6.79%.

The solar cell was tested for energy conversion efficiency under certain curl conditions, thus verifying the flexibility of the solar cell of the present invention. Table 1 shows the bending angle-cell efficiency relationship of the solar cells prepared in Example 1 of the present invention. The nanopaper-based flexible solar cells prepared through the above steps were respectively bent around five glass rods with different radii (3.5 mm, 8.6 mm, 12.6 mm, 19.5 mm, 32.2 mm), and then they were spread out to get their photovoltaic conversion efficiency measured and compared. It can be seen from Table 1 that the photovoltaic conversion efficiency of the nanopaper-based flexible solar cells was basically unchanged before and after the cells were bent around the above glass rods with different radii, with the ratio of the photovoltaic conversion efficiency after the bending to the photovoltaic conversion efficiency before the bending being 1.02-1.08. This indicated that the nanopaper-based flexible solar cells prepared by the present invention had very excellent bendability and flexibility. These properties, resulted from the fiber network structure of the paper, can form the electronic devices into a flexible and bendable overall structure.

TABLE 1

| Bending radius (mm) | Average photovoltaic conversion efficiency before and after bending | Ratio of the photovoltaic conversion efficiency after bending to the photovoltaic conversion efficiency before bending |
| --- | --- | --- |
| 3.5 | 7.02 | 1.08 |
| | 7.14 | |
| 8.6 | 7.04 | 1.06 |
| | 7.08 | |
| 12.6 | 7.01 | 1.02 |
| | 7.03 | |
| 19.5 | 7.02 | 1.03 |
| | 7.04 | |
| 32.2 | 7.02 | 1.03 |
| | 7.04 | |

The solar cell device of the present invention was tested under the simulated illumination of 85 mW/cm$^2$ at 25° C. and AM1.5; the reference standard devices 1 and 2 were tested under the simulated illumination of 75 mW/cm$^2$ at 25° C. and AM1.5, while the reference standard device 3 was tested under the simulated illumination of 85 mW/cm$^2$ at 25° C. and AM1.5; the reference standard devices (the standard devices 1, 2 and 3) were all solar cells with similar structure on an ITO substrate. The efficiency of the standard devices 1, 2 and 3 was 1.75%, 1.18% and 4.08%, respectively; and the efficiency of the devices in Examples 1-4 of the present invention was 6.08% to 7.02%.

The above embodiments are only used to clearly illustrate the examples of the present invention, and are not intended to limit the embodiments of the present invention. For those of ordinary skill in the art, various changes or modifications can be made on the basis of the above description. It is unnecessary and impossible to enumerate all the embodiments here. Any modification, equivalent replacement and improvement made within the scope of the spirit and principle of the present invention are included in the protection scope of the claims of the present invention.

The invention claimed is:

1. A method for preparing bendable nanopaper-based flexible solar cells by 3D aerogel jet printing, characterized in that: this method comprises the following steps:
   1) soaking all-cellulose paper in an ionic liquid for 10-30 s, and then hot-pressing for 30-120 s to partially dissolve the surface of the all-cellulose paper and fill pores thereon, so as to achieve the consistency of optical refractive index in the thickness direction, wherein the ionic liquid is an imidazole ionic liquid or a zinc chloride solution;
   2) soaking the partially dissolved all-cellulose paper in absolute ethanol for 5-30 s to remove the ionic liquid, and allowing the dissolved cellulose to get re-aggregated to produce regenerated cellulose paper;
   3) hot-press drying the regenerated cellulose paper, and cooling to room temperature under pressure;
   4) repeating steps 1) to 3) multiple times with the dried all-cellulose paper obtained in step 3) to obtain nanopaper with high light transmittance and high haze;
   5) preparation of dispersions of respective hierarchical materials of solar cells: preparing ethanol dispersions of $MoO_3$, Ag, Ag NWs and CuPc, respectively; preparing o-dichlorobenzene dispersions of $C_{50}$ and PTCBI, respectively; and preparing an isopropanol dispersion of BCP;
   6) printing cathode: loading the ultrasonically dispersed dispersion into a printer cartridge, and printing an $MoO_3$ layer of 6-15 nm, an Ag layer of 6-20 nm and an $MoO_3$ layer of 6-15 nm successively on the surface of nano-optical paper fixed on a sample stage of the 3D printer, wherein these layers each have the same shape and together form a cathode block; arranging a plurality of the cathode blocks longitudinally and laterally at intervals into a square array to form a cathode; allowing the nano-$MoO_3$ layer to volatilize the solvent at 80° C. to 110° C. for 10-30 min after printing, and annealing the nano-Ag layer at 80° C. to 110° C. for 10-30 min after printing;
   7) Printing effective layer: loading the ultrasonically dispersed dispersion into the printer cartridge, and printing a CuPc layer of 30-50 nm, a $C_{50}$ layer of 30-50 nm, a PTCBI layer of 30-50 nm and a BCP layer of 6 nm on the surface of the square-array cathode of the nano-optical paper, wherein these layers each have the same shape and together form an effective layer strip; arranging a plurality of the effective layer strips longitudinally or laterally at intervals to form an effective layer, and allowing each layer of the effective layer to volatilize the solvent at 80° C. to 110° C. for 10-30 min after printing; and
   8) printing anode: loading the ultrasonically dispersed dispersion into the printer cartridge, and printing a PFN layer of 5-20 nm and an Ag NWs layer of 6-20 nm successively on the surface of the effective layer of the nano-optical paper, wherein the PFN layer and the Ag NWs layer have the same shape and together form an anode block, and each anode block overlaps by 3-5 µm with two adjacent cathodes arranged in the length direction; arranging a plurality of the anode blocks longitudinally and laterally at intervals into a square array to form an anode; and annealing the PFN layer and the Ag NWs layer at 80° C. to 110° C. for 10-30 min after printing, respectively.

2. The method for preparing bendable nanopaper-based flexible solar cells by 3D aerogel jet printing according to claim 1, characterized in that: the hot-pressing in step 1) is accomplished by applying a pressure of 0.5-2 MPa to the soaked all-cellulose paper sandwiched between polytetrafluoroethylene films using a plate vulcanizer at 75° C. to 120° C.

3. The method for preparing bendable nanopaper-based flexible solar cells by 3D aerogel jet printing according to claim 1, characterized in that: in step 1), the imidazole ionic liquid is an N-ethylimidazole hydrogen phosphite ionic liquid, and the concentration of the zinc chloride solution is 65 wt %.

4. The method for preparing bendable nanopaper-based flexible solar cells by 3D aerogel jet printing according to claim 1, characterized in that: the all-cellulose paper in step 1) is a Double-circle medium-speed qualitative filter paper.

5. The method for preparing bendable nanopaper-based flexible solar cells by 3D aerogel jet printing according to claim 1, characterized in that: in step 3), the "hot-press drying" is accomplished by hot-press drying the regenerated cellulose paper at a temperature of 60° C. to 80° C. and a pressure of 2-5 MPa using the plate vulcanizer for 10-30 min, and the "cooling to room temperature under pressure" is done slowly under a pressure of 2-5 MPa.

6. The method for preparing bendable nanopaper-based flexible solar cells by 3D aerogel jet printing according to claim 1, characterized in that: in step 5), the ethanol dispersions of $MoO_3$, Ag, Ag NWs and CuPc have a concentration of 0.05-0.2 wt %, the o-dichlorobenzene dispersions of $C_{50}$ and PTCBI have a concentration of 0.05-0.2 wt %, the isopropanol dispersion of BCP has a concentration of 0.05-0.2 wt %, and the hierarchical material dispersions have a concentration of 4-40 cp, and these dispersions are ultrasonically dispersed for 30-40 min before being used.

7. The method for preparing bendable nanopaper-based flexible solar cells by 3D aerogel jet printing according to claim 1, characterized in that: in step 6), the length, width and thickness of each cathode block are 15-30 µm, 5-10 µm and 18-50 nm, respectively, and these cathode blocks are arranged longitudinally and laterally at an interval of 2-5 µm and 5-10 µm, respectively.

8. The method for preparing bendable nanopaper-based flexible solar cells by 3D aerogel jet printing according to claim 1, characterized in that: in step 7), the length, width and thickness of the effective layer strips are 150-300 µm, 15-30 µm and 80-150 nm, respectively, and these effective layer strips are arranged longitudinally and laterally at an interval of 2-5 µm and 5-10 µm, respectively.

9. The method for preparing bendable nanopaper-based flexible solar cells by 3D aerogel jet printing according to claim 1, characterized in that: in step 8), the length, width and thickness of each anode block are 15-30 µm, 5-10 µm and 11-40 nm, respectively, and these anode blocks are arranged longitudinally and laterally at an interval of 2-5 µm and 5-10 µm, respectively.

10. The method for preparing bendable nanopaper-based flexible solar cells by 3D aerogel jet printing according to claim 1, characterized in that: the printer cartridge in steps 6), 7) and 8) is a UC-320 printer cartridge, and the "repeating steps 1) to 3) multiple times" mentioned in step 4) means repeating steps 1) to 3) for 2-3 times.

* * * * *

UNITED STATES PATENT AND TRADEMARK OFFICE
CERTIFICATE OF CORRECTION

PATENT NO. : 11,849,626 B2
APPLICATION NO. : 17/257894
DATED : December 19, 2023
INVENTOR(S) : Detao Liu et al.

It is certified that error appears in the above-identified patent and that said Letters Patent is hereby corrected as shown below:

In the Claims

Column 13, Line 27, delete "$C_{50}$" and insert --$C_{60}$--

Column 13, Line 45, delete "$C_{50}$" and insert --$C_{60}$--

Column 14, Line 31, delete "$C_{50}$" and insert --$C_{60}$--

Signed and Sealed this
Twenty-first Day of May, 2024

Katherine Kelly Vidal
*Director of the United States Patent and Trademark Office*